US011250191B1

(12) United States Patent
Bachchu et al.

(10) Patent No.: US 11,250,191 B1
(45) Date of Patent: Feb. 15, 2022

(54) OFFLINE FUNCTIONAL COVERAGE COLLECTION

(71) Applicant: Amazon Technologies, Inc., Seattle, WA (US)

(72) Inventors: Kiran Bachchu, San Jose, CA (US); Horace Lau, Mountain View, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/301,289

(22) Filed: Mar. 30, 2021

(51) Int. Cl.
*G06F 30/3308* (2020.01)
*G06F 30/333* (2020.01)
*G06F 30/327* (2020.01)
*G06F 30/20* (2020.01)
*G06F 30/367* (2020.01)
*G06F 11/00* (2006.01)
*G01R 31/28* (2006.01)

(52) U.S. Cl.
CPC ........ *G06F 30/3308* (2020.01); *G06F 30/327* (2020.01); *G06F 30/333* (2020.01); *G01R 31/28* (2013.01); *G06F 11/00* (2013.01); *G06F 30/20* (2020.01); *G06F 30/367* (2020.01)

(58) Field of Classification Search
CPC .. G06F 30/3308; G06F 30/333; G06F 30/327; G06F 30/20; G06F 30/367; G06F 11/00; G01R 31/28
USPC ....... 716/106, 111, 136; 703/15, 16; 714/33, 714/741
See application file for complete search history.

(56) References Cited

U.S. PATENT DOCUMENTS

| 7,890,902 | B1* | 2/2011 | Sahu | G06F 30/33 716/106 |
| 7,971,176 | B2* | 6/2011 | Desineni | G01R 31/31835 716/136 |
| 8,560,985 | B1* | 10/2013 | Sahu | G06F 30/33 716/106 |
| 8,671,373 | B1* | 3/2014 | Deaton | G06F 30/3323 716/106 |
| 9,665,350 | B1* | 5/2017 | Kalmar | G06F 11/3676 |
| 10,599,798 | B1* | 3/2020 | Kim | G06F 30/30 |
| 11,048,844 | B1* | 6/2021 | Miseldine | G06F 30/3308 |

(Continued)

FOREIGN PATENT DOCUMENTS

JP 2015001808 A * 1/2015 ........... G06F 30/331

OTHER PUBLICATIONS

Jiang et al., Chinese Patent Document No. CN-105302573-A, published Feb. 3, 2016, front page. (Year: 2015).*

(Continued)

*Primary Examiner* — Phallaka Kik
(74) *Attorney, Agent, or Firm* — Weaver Austin Villeneuve & Sampson LLP

(57) ABSTRACT

Aggregation of coverage data for a design-under-test (DUT) can be performed using a coverage testbench without running any simulations on the DUT. Stimulus data that was used previously for performing different simulations on the DUT can be saved in a database. The coverage testbench can read the saved stimulus data and aggregate the coverage data from the stimulus data using a coverage model. When the DUT is updated, the coverage model can be updated, and updated coverage data can be collected using the coverage testbench without re-running the simulations on the DUT.

20 Claims, 7 Drawing Sheets

(56) References Cited

U.S. PATENT DOCUMENTS

| | | | | |
|---|---|---|---|---|
| 2004/0243371 | A1* | 12/2004 | Gutkovich | G06F 30/33 |
| | | | | 703/14 |
| 2007/0011633 | A1* | 1/2007 | Weber | G06F 30/3323 |
| | | | | 716/103 |
| 2007/0168727 | A1* | 7/2007 | Fournier | G01R 31/318314 |
| | | | | 714/25 |
| 2008/0092004 | A1* | 4/2008 | Watkins | G01R 31/3016 |
| | | | | 714/738 |
| 2008/0104556 | A1* | 5/2008 | Yamada | G06F 30/33 |
| | | | | 716/102 |
| 2009/0204932 | A1* | 8/2009 | Bormann | G06F 30/3323 |
| | | | | 716/106 |
| 2009/0240458 | A1* | 9/2009 | Desineni | G01R 31/31835 |
| | | | | 702/120 |
| 2012/0324286 | A1* | 12/2012 | Birnbaum | G06F 11/3608 |
| | | | | 714/26 |
| 2014/0372962 | A1* | 12/2014 | Uchibori | G06F 30/331 |
| | | | | 716/136 |
| 2018/0101632 | A1* | 4/2018 | Kim | G06F 30/30 |
| 2020/0019664 | A1* | 1/2020 | Dutta | G06F 30/367 |
| 2021/0056009 | A1* | 2/2021 | Gal | G06N 20/00 |

OTHER PUBLICATIONS

Masato et al., Japanese Patent Document No. JP-2016081397-A, published May 16, 2016, front page. (Year: 2016).*

* cited by examiner

300

STIMULUS DATA
302

SIMULATION 1:
    INPUT A 0x1010
    INPUT B 0x0

SIMULATION 2:
    INPUT A 0x0101
    INPUT B 0x1

SIMULATION 3:
    INPUT C 0x11
    INPUT D 0
    INPUT B 0x1

COVERAGE DATA
304

CROSSED A AND B
    COVERAGE POINTS (40%)

CROSSED C, D AND B:
    COVERAGE POINTS (30%)

INPUT B:
    COVERAGE POINTS (75%)

FIG. 3

OFFLINE FUNCTIONAL COVERAGE COLLECTION

BACKGROUND

Verification process is a critical step in the product development cycle of an integrated circuit, and can be used to uncover potential errors in the design or the architecture of the design. Verification process is generally accomplished by running simulations on a model of the design against various stimuli to ensure functional correctness of the design. Functional coverage is a metric which can be used to identify the features or functionalities of the design that have been exercised by the stimuli. Coverage results can be analyzed to identify gaps in the stimuli. The design can be tested again with updated stimuli to fill the coverage gaps. This process can be repeated until a desired coverage goal is achieved.

BRIEF DESCRIPTION OF THE DRAWINGS

Various embodiments in accordance with the present disclosure will be described with reference to the drawings, in which:

FIG. 3 illustrates examples of stimulus data and coverage data, which can be used to describe certain embodiments;

DETAILED DESCRIPTION

Figure 1:
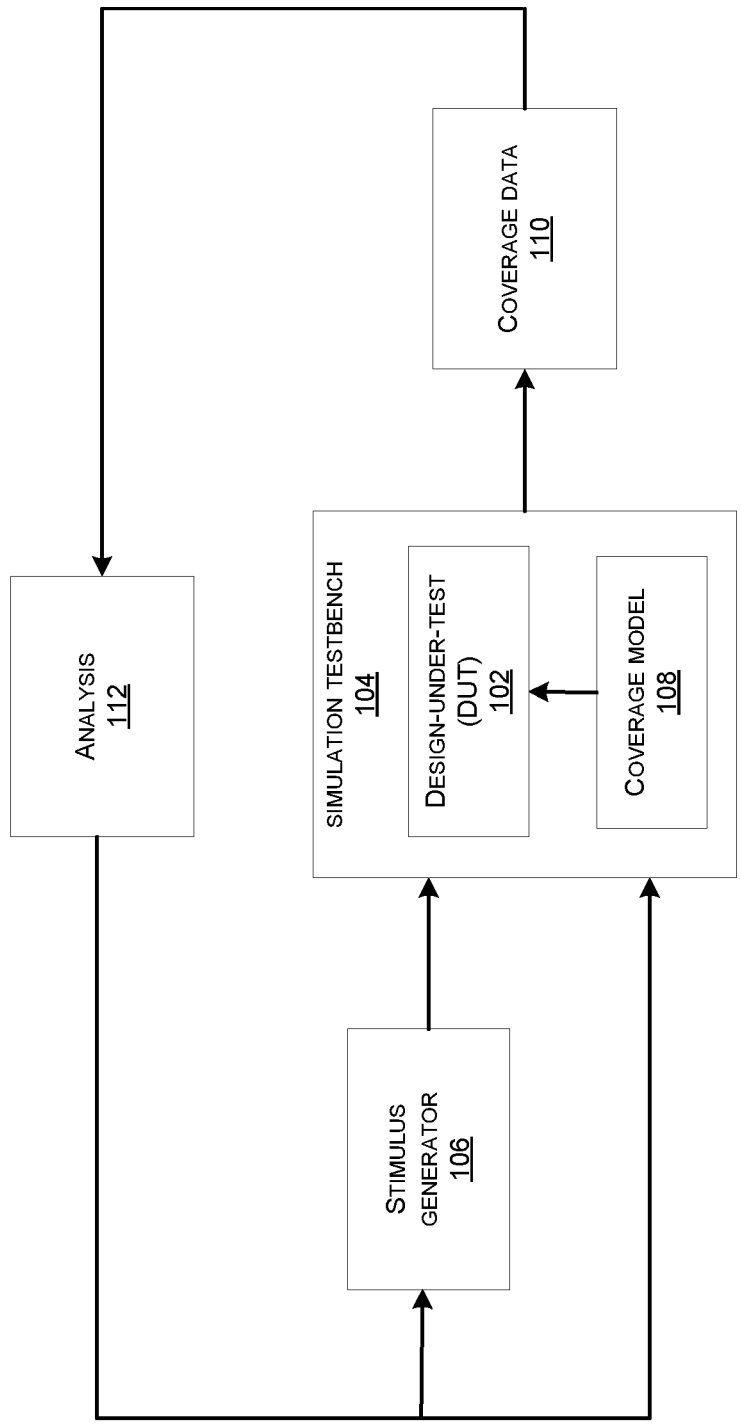
FIG. 1 illustrates a process flow, which can be used to determine functional coverage of a design-under-test (DUT)

Size of integrated circuits (e.g., System-on-chips (SoCs)) has been increasing to support complex functionalities demanded by modern day applications such as artificial intelligence (AI), Internet-of-Things (IoT), networking, cloud computing or high-performance computing, among others. A thorough functional verification of the design of an integrated circuit before tape-out is crucial in order to minimize design re-spins. Generally, during the implementation phase, the design of the integrated circuit is described using a hardware description language (HDL) or register transfer language (RTL) based on the specification of the design. Functional verification of the design can be performed by injecting different stimuli into the RTL model of the design using a testbench for running simulations to iron out the design errors or functional errors. Stimulus data for the simulations can be generated using some randomized elements, which can be controlled using constraints. In certain examples, use of different seeds for the randomized elements can provide different test scenarios.

Regression testing can be performed to test the design continuously through implementation and modification phase to fix design errors and ensure that design modifications or new features do not introduce additional errors. A regression test suite generally comprises stimulus data for a set of test cases to fully verify the design against a test plan. The test plan may define the verification scope which can relate to different test scenarios, internal states of the design, high level operation flow, functional modes, logic-level sequences, etc. They are mapped to quantifiable metrics, so the verification progress can be observed by reaching their satisfactory values.

Functional coverage is a metric used to determine the extent of the design functionality that has been exercised or covered by the stimulus data using a functional coverage model. A functional coverage model can be developed to verify that the behavior of the design responding to the stimulus meets various aspects of the specification including functional requirements, interface requirements, or different protocol specifications. The functional coverage model can be described using functional verification coverage constructs for any suitable hardware verification language (HVL) such as SystemVerilog®. A functional coverage point can map to a functionality that has been tested based on a test plan. As different functionalities to be tested are hit in the simulation, the functional coverage points can be updated.

Generally, the functional coverage collection can be a highly iterative process that may involve defining the coverage model, collecting coverage data from different simulations, analyzing coverage data to refine coverage points or stimulus, and re-running simulations to collect updated coverage data. For large designs, this process may occur over a long period of time (e.g., weeks and months) because the coverage collection generally happens in real-time during the simulation runs, where simulation of large designs can take several hours or even days each. In most cases, it is not possible to collect the coverage data for simulation runs before the coverage model is defined, which can account for a large percentage of total simulation cycles run on a design. Once the coverage model is defined, it may take multiple regression runs (e.g., months) to achieve the desired coverage goal by testing different scenarios.

Embodiments can provide methods to perform offline aggregation of coverage data using stimulus data that was previously used for performing simulations on a design-under-test (DUT). For example, the stimulus data used for functional verification of the DUT can be stored in a database as it is generated and/or applied to the DUT to perform the simulations. The stimulus data may include various stimuli generated over a period of time (e.g., months) as functional verification of the DUT is performed. The stored stimulus data can be read using a coverage testbench to aggregate coverage data using a coverage model without re-running the simulations on the DUT.

Generation of the coverage data from the saved static stimulus data can provide a drastic decrease in the coverage collection times since the run time for the collection of coverage data can be more than 100× faster than the runtime for aggregating the coverage data in parallel with running the simulations. Thus, when the DUT or the coverage model is updated, the embodiments can allow re-aggregating the coverage data using the coverage testbench without re-running the simulations on the DUT. The stored stimulus data can also allow performing deeper analysis on the robustness of the stimulus, refining the coverage model and updating the coverage data in a very short time and can provide full visibility into the entire history of the stimulus that has been used to perform the simulations on the design.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates a process flow 100, which can be used to determine functional coverage of a design-under-test (DUT).

A design-under-test (DUT) 102 may include a register-transfer-language (RTL) model of an integrated circuit (IC) device based on the specification. For example, the RTL model of the design can be developed using any hardware description language including Verilog, VHDL, among others. The IC device can be a system-on-chip (SoC), a field programmable gate array (FPGA), or another type of circuit, which has been designed to include certain features based on the specification. In certain examples, the DUT 102 can include one or more of a multi-core processor, an accelerator, a graphics processing unit (GPU), a central processing unit (CPU), a micro-controller, an on-chip memory, a memory controller, a network controller, and any application specific integrated circuit (ASIC). In certain examples, the DUT 102 can be a large SoC comprising ASIC(s), intellectual property (IP) circuits, on-chip memories, and other circuits to support the functionality of the design.

Generally, a verification test plan is developed to verify the DUT 102 during the implementation phase. A simulation testbench 104 can be used to perform simulations on the DUT 102 based on the verification plan. Simulations can be performed using any suitable electronic design automation (EDA) tool. The verification plan can define scope of the verification process to test different scenarios including configurations, internal states, logic-level sequences, operational flows, or functional modes of the DUT 102. In certain examples, regression testing can be performed to determine progress of the verification process according to the plan. For example, the simulation testbench 104 can be used to run a plurality of functional simulations to verify that the DUT 102 is functionally correct based on the specification as new features are added or design bugs are fixed.

The stimulus data for running the simulations can be generated using a stimulus generator 106. The stimulus generator 106 can generate the stimulus data comprising a set of test cases randomly or pseudo-randomly that can cause the DUT 102 to perform one or more functions. In certain implementations, a constraints solver can be used to generate the test cases. For example, the stimulus generator 106 can allow applying constraints to control the randomization process, which can provide various testing scenarios to test different functionalities of the DUT 102. Generally, the process flow 100 may include generating the stimulus data by the stimulus generator 106 and inputting the stimulus data into the DUT 102 to run the functional simulations, and verify that the DUT 102 performed the function(s) correctly. In certain implementations, a checker can be part of the simulation testbench 104, which can be used to compare the simulation results with the expected results to verify that the DUT 102 behaved as expected.

The process flow 100 may further include determining whether the features or functionalities that have been tested by the stimulus data meet a coverage goal using a coverage model 108. The coverage model 108 can be described using any suitable language to verify that the behavior of the design responding to the stimuli meets various aspects of the specification including functional requirements, interface requirements, and different internal or external protocol specifications. For example, the coverage model 108 may include code to determine which functionalities of the DUT 102 have been covered by the stimulus data based on values of the stimulus data that were exercised during the simulations. The coverage model 108 can be described using constructs for a hardware verification language such as SystemVerilog®.

In certain implementations, the coverage model 108 can be integrated (or compiled) with the RTL model of the DUT 102 to collect coverage data 110 for the applied stimuli while running simulations using the simulation testbench 104. The coverage model 108 can collect the coverage data 110 by measuring which design features have been exercised by the stimuli based on the simulation results. The coverage data 110 may be expressed using a suitable metric based on the EDA tool used for the simulations. For example, for Verilog simulations, the coverage data 110 may include coverage points, cover groups, or coverage bins based on the specification of the DUT 102. A functional coverage point can map to a functionality that has been tested based on a test plan. As different functionalities to be tested are hit in the simulation, the functional coverage points can be updated.

The process flow 100 may further include performing analysis 112 on the coverage data 110 to determine whether the coverage goal of the verification plan has been met. For example, the analysis 112 may include analyzing quality of the test stimuli against various coverage points hit during the simulations. As a result of the analysis 112, gaps in the coverage data 110 can be identified and additional stimulus data can be generated to fill those coverage gaps. For example, different constraints to test specific features can be applied to the stimulus generator 106 to generate a new set of test cases. In certain examples, targeted test cases can be developed to cover the corner cases. The coverage model 108 can also be refined based on the analysis 112 of the coverage data 110, e.g., to fix errors, update or add coverage points. The steps in the process flow 100 can be repeated until a desired coverage goal has been met.

The coverage model 108 of the design can be developed at any stage of the implementation phase. However, developing the coverage model 108 once the RTL model of the design is stable and functionally accurate can minimize updating the coverage model 108 frequently to keep up with the bug fixes or design changes in the RTL model during the implementation phase. However, developing the coverage model 108 after the RTL model of the DUT 102 is stable can further delay determining the functional coverage of the DUT 102. Generally, regression test suites can be run on the RTL model to ensure functional correctness of the DUT 102 as new features are added or bugs are fixed. The coverage data 110 can be collected using the coverage model 108 as the simulations are performed on the RTL model of the DUT 102. In certain cases, the EDA tool can provide an option to run the simulations in the coverage mode to allow generating the coverage data 110 while running the simulations.

Running the simulations with the coverage model 108 can slow down the simulation process due to additional compute cycles consumed to generate the coverage data 110. In certain instances, the stimulus data that is being injected into the DUT 102 during simulations is generated randomly based on the constraints, which can further slow down the simulation process. Additionally, as the RTL model is updated to fix bugs or add new features, the coverage model 108 may need to be updated as well, and the simulations may need to be re-run to collect the coverage data 110 again. Once the coverage data 110 is analyzed and the coverage gaps are identified, new stimulus data can be generated, and the simulations can be re-run to collect the updated coverage data. The process to run the simulations and collect the coverage data 110, refine the coverage model 108 and the stimuli based on analyzing the coverage data 110, and re-run the simulations to collect the updated coverage data can span over a long period of time (e.g., weeks and months). This problem is further exacerbated for large integrated circuit devices with multiple functionalities on the same chip (e.g., SoCs). Thus, it is desirable to accelerate the process of determining the functional coverage, which can reduce the verification cycle and ultimately the product development cycle.

Certain embodiments can provide a method to accelerate collection of the coverage data as described with reference to FIG. 2.

Figure 2:
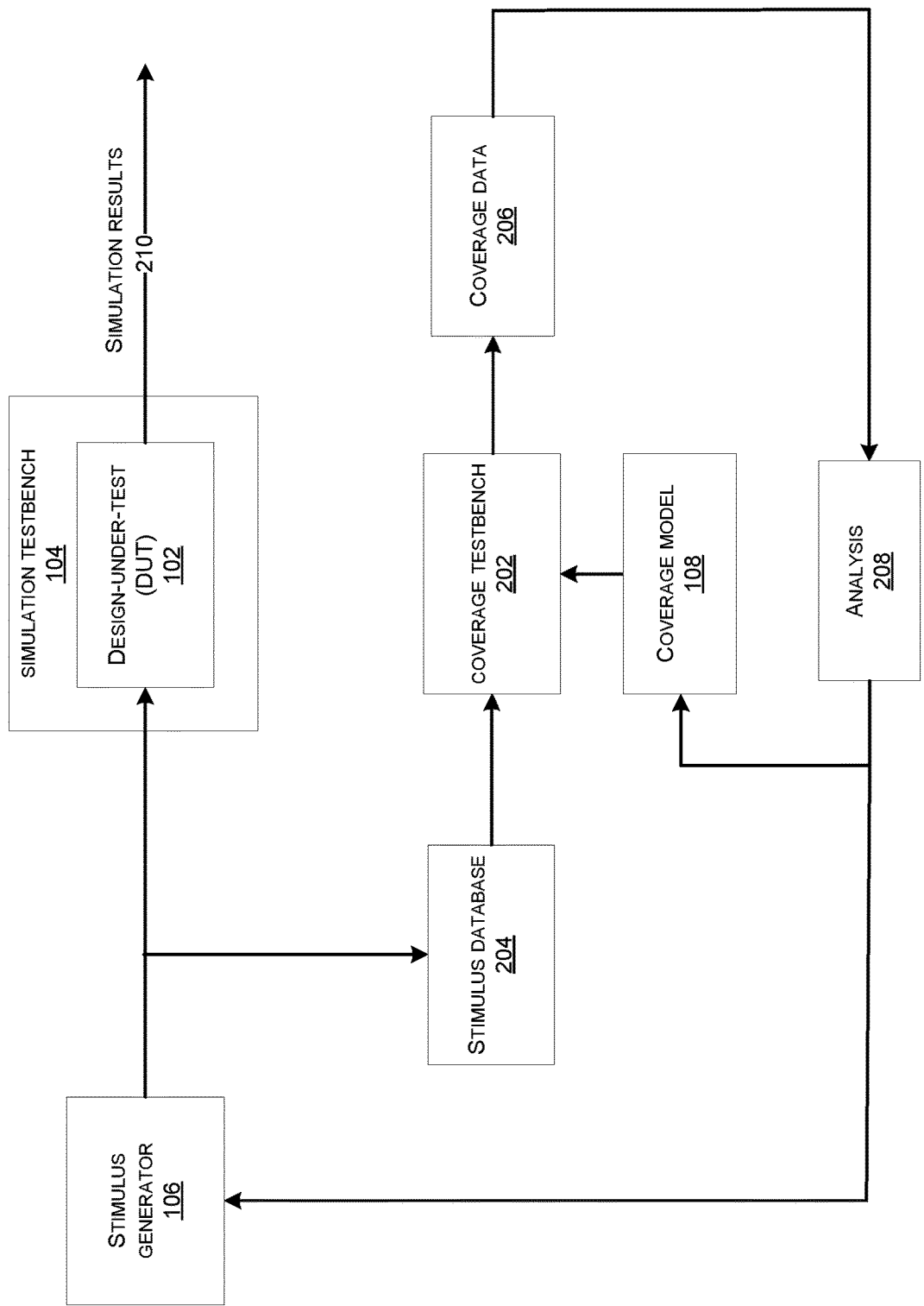
FIG. 2 illustrates a process flow, which can be used to determine the functional coverage of the DUT from saved stimulus data using a coverage testbench, according to certain embodiments.

FIG. 2 illustrates a process flow 200, which can be used to determine the functional coverage of the DUT from saved stimulus data using a coverage testbench, according to certain embodiments.

In certain embodiments, the stimulus data generated by the stimulus generator 106 for running different functional simulations on the DUT 102 can be saved in a stimulus database 204. The stimulus data stored in the stimulus database 204 may include valid combinations of input values that were injected into the DUT 102 to run a plurality of simulations at different times. For example, the stimulus data can be generated and stored in real time as the simulations are performed and simulation results 210 indicate that the stimuli used for the simulation correctly verified a certain feature or functionality of the design based on the specification. The stimulus data can be collected over a long period of time (e.g., weeks and months) as different simulations are run to perform functional verification of the DUT 102. The stimulus database 204 can be implemented using any suitable data structure. As new simulations are run on the DUT 102 over time, the stimulus database 204 can be appended with the stimulus data for each simulation.

A coverage testbench 202 can be used to read the stimulus data stored in the stimulus database 204 and aggregate coverage data 206 using the coverage model 108 to determine the functional coverage of the DUT 102 based on the saved stimulus data. The coverage model 108 may comprise coverage points based on the specification of the DUT 102. The coverage model 108 may be developed based on the specification of the DUT 102 as discussed with reference to FIG. 1, and can be defined using HVL constructs or another suitable language. In certain examples, the EDA tool can be used to select the coverage points and run the coverage testbench 202 with the coverage model 108. The coverage testbench 202 can aggregate the coverage data based on the coverage points to provide the functional coverage without running the simulations on the DUT 102. The aggregated coverage data can indicate which valid combinations of inputs to the DUT 102 were used in the simulations.

The saved stimulus data may include different values that were inputted to the DUT 102 to perform a plurality of functional simulations at different times. An example of the stimulus data and coverage data is shown in FIG. 3. Stimulus data 302 can be part of the stimulus data that was generated by the stimulus generator 106 and stored in the stimulus database 204. For example, the stimulus data 302 may include different values for inputs A, B, C, and D for a simulation 1, a simulation 2 and a simulation 3 that were injected into the DUT 102 at different times to test different functionalities. The input values for the simulation 1 and simulation 2 may have been generated randomly while running the simulations, and the input values for the simulation 3 may have been generated prior to running the simulations. The input values for the stimulus data 302 may provide valid combinations of inputs that verified the functionality of the DUT 102 correctly.

An example coverage data 304 is shown in FIG. 3, which shows coverage points aggregated by the coverage testbench 202 using the coverage model 108 to provide the functional coverage of the simulations 1, 2, and 3. For example, the coverage testbench 202 may read the stimulus data 302 and access the coverage model 108 to aggregate the coverage data 304. The coverage model 108 may include code to provide the coverage points based on the stimulus data 302 by determining which functionalities of the DUT 102 are covered based on different values of the inputs A, B, C, and D that were exercised by the stimulus data 302.

Thus, the coverage collection times can be drastically reduced since the coverage data 206 can be collected in a very short time (e.g., a few minutes) from the stimulus data stored during the plurality of simulations run over a long period of time (e.g., days and months). The process flow 200 may also include performing analysis 208 on the coverage data 206, which can be used to further refine the coverage model 108 and/or the coverage points iteratively using the coverage test bench 202. For example, the analysis 208 may determine that the functional coverage contains a gap.

In certain embodiments, the coverage testbench 202 and the coverage model 108 can be implemented using a scripting language (e.g., Python, JavaScript). For example, the coverage model 108 can be implemented using Python, and a coverage script can be developed in Python to perform the steps of the coverage testbench 202. The coverage script can also be used to perform the analysis 208. For example, the coverage script can be used to analyze the coverage data 206 against the stored stimulus data to identify the combination of input values that are not covered by the stimulus data, and send the analysis results (e.g., coverage gaps) to the stimulus generator 106.

In such cases, new stimulus data can be generated to cause the DUT 102 to perform a function that covers the gap and use the new stimulus data in another functional simulation using the simulation testbench 104. The new stimulus data can be generated by tuning or altering the constraints applied to the stimulus generator 106, or can include a targeted test case. The new stimulus data can also be stored in the stimulus database 204 and read by the coverage testbench 202 to re-aggregate the coverage data 206 to include coverage of the new stimulus data. Thus, this offline coverage collection using the process flow 200 can help achieve the coverage goal in a much quicker manner than the process flow described in FIG. 1.

Certain embodiments can be used to perform deeper analysis on the robustness of the stimulus since the time to refine the coverage model 108 and update the coverage data 206 is much shorter. It can further provide full visibility into the entire history of the stimulus data that has been used to run simulations on the DUT 102, which can be beneficial when defining future versions of the IC device or the verification plan.

Figure 4:
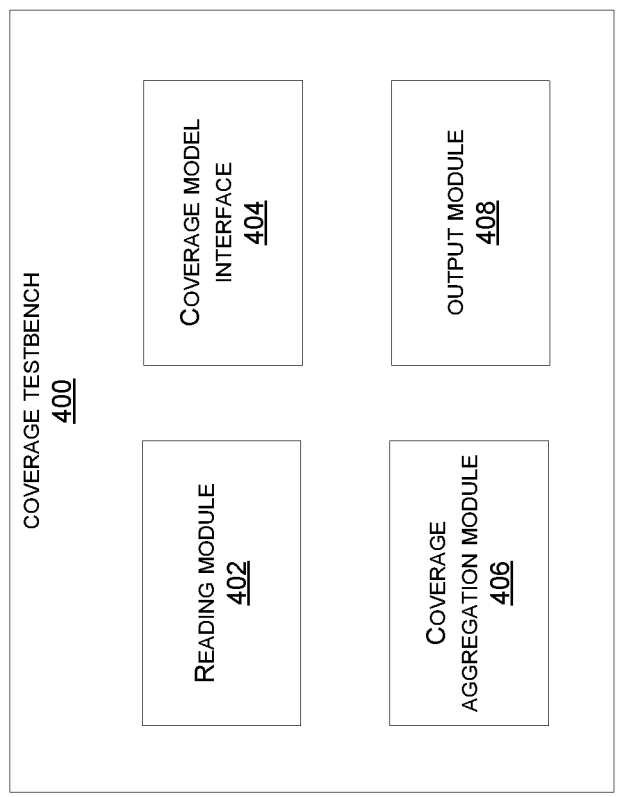
FIG. 4 illustrates example components of a coverage testbench, which can be used to describe certain embodiments.

FIG. 4 illustrates example components of a coverage testbench 400, which can be used to describe certain embodiments. The coverage testbench 400 can be the coverage testbench 202 described with reference to FIG. 2. The coverage testbench 400 may include a reading module 402, a coverage model interface 404, a coverage aggregation module 406, and an output module 408. In certain implementations, the coverage testbench 400 may be implemented using code that is compatible with an EDA tool used for collecting the coverage data. For example, the coverage testbench 400 may be implemented using SystemVerilog®, or similar language. In some embodiments, the coverage testbench 400 can be implemented using a scripting language, e.g., Python or JavaScript.

The reading module 402 can be used to read the stimulus data stored in the stimulus database 204. The stimulus data may be stored in the stimulus database 204 in a format that is compatible with the EDA tool, or can be read using a scripting language. For example, the stimulus data may be stored in a file format that can be read by the reading module 402 to be analyzed by the coverage model 108. Note that the embodiments are not limited to any specific formats used for storing the stimulus in the stimulus database 204 or reading the stored stimulus data from the stimulus database 204, and can support any format without deviating from the scope of the disclosure.

The coverage model interface 404 can be used to access the coverage model 108. For example, the coverage model interface 404 can be used to load the coverage model 108 into the coverage testbench 202 so that the coverage model 108 can determine the coverage data for each of the simulations based on the stimulus data read using the reading module 402.

The coverage aggregation module 406 may be used to aggregate the coverage data 206. For example, the coverage aggregation module 406 may be used to initiate the coverage collection process the coverage model 108. The coverage data may be determined based on the coverage points defined in the coverage model 108. As an example, the aggregated coverage data may include the coverage data 304, which can be collected based on the stimulus data 302.

The output module 408 may be used to provide the functional coverage of the DUT 102 based on the aggregated coverage data. In certain embodiments, the output module 408 may generate a report with all the aggregated coverage data which can provide overall functional coverage of the DUT 102 in a suitable format, which can be used for the analysis 208. The functional coverage can be analyzed to identify any coverage gaps.

Figure 5:
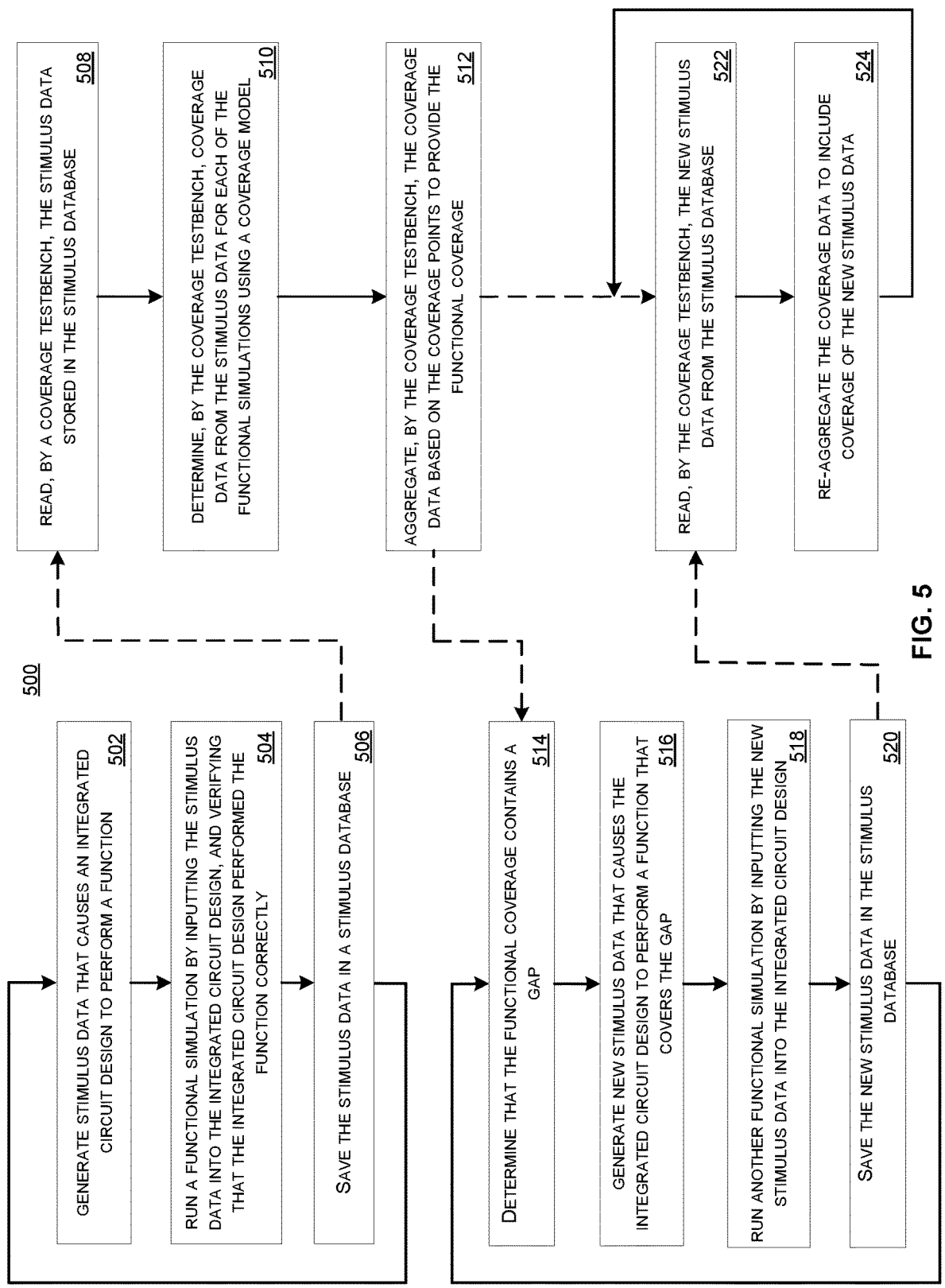
FIG. 5 illustrates a flowchart for a computer-implemented method for determining functional coverage of the stimulus data used for simulating an integrated circuit design, according to certain embodiments.

FIG. 5 illustrates a flowchart 500 for a computer-implemented method for determining functional coverage of the stimulus data used for simulating an integrated circuit design, according to certain embodiments. The integrated circuit design can be an RTL model of an integrated circuit device. The computer-implemented method may be performed using the process flow 200.

At step 502, the method may include generating stimulus data that causes the integrated circuit design to perform a function. For example, the integrated circuit design can be the DUT 102 in FIG. 2. The stimulus data can be generated using the stimulus generator 106 based on the specification of the integrated circuit. The stimulus data can be generated randomly or pseudo-randomly using some constraints. The stimulus data may include valid combinations of the inputs of the DUT 102, which can cause the DUT 102 to perform a certain function based on the specification. For example, performing the function may include accessing a memory or a peripheral, performing an arithmetic computation, switching to a power-saving mode, or communicating with a device on a network, among others. The stimulus data can be generated prior to running the simulations or as the simulations are running.

At step 504, the method may include running a functional simulation by inputting the stimulus data into the integrated circuit design, and verifying that the integrated circuit design performed the function correctly. The stimulus data generated by the stimulus generator 106 can be injected into the DUT 102 for running the functional simulation using the simulation testbench 104, which can cause the DUT 102 to perform the function and generate outputs based on the combination of the inputs. The outputs can be part of the simulation results 210. In certain implementations, the simulation testbench 104 may include the setup to verify that the DUT 102 performed the function correctly by comparing the simulation results 210 with expected results. For example, the simulation testbench 104 may include a checker to provide the expected results based on the specification of the DUT 102 given the same stimulus data.

At step 506, the method may include saving the stimulus data in a stimulus database. The stimulus data used for performing a plurality of simulations on the DUT 102 over a period of time can be saved in the stimulus database 204. In certain examples, the stimulus data that is saved includes valid combinations of the inputs to the DUT 102 that were used in the simulations to correctly verify the functionality of the DUT 102 (e.g., the test cases that passed the simulations). The stimulus data can be saved as the simulations are run on the DUT 102, before running the simulations as the stimulus data is generated, or after running the simulations. For example, the step 506 can be part of the step 502 or the step 504. The steps 502-506 can be repeated for a plurality of simulations performed on the DUT 102 over a period of time, as the integrated circuit design is tested to ensure that the design behaves according to the specification. The coverage model 108 can be developed during this time as the integrated circuit design becomes stable.

At step 508, the method may include reading, by a coverage testbench, the stimulus data stored in the stimulus database. For example, subsequent to running the plurality of functional simulations, and saving the stimulus data in the stimulus database 204, the saved stimulus data can be read by the coverage testbench 202 using the reading module 402. The stimulus data stored in the stimulus database 204 can provide full visibility into the entire history of the stimulus used for performing the simulations on the DUT 102.

At step 510, the method may include determining, by the coverage testbench, coverage data from the stimulus data for each of the functional simulations using a coverage model. The coverage model may include coverage points based on the specification of the integrated circuit design. The coverage testbench 202 may use the coverage model 108 to determine the coverage data 206 from the saved stimulus data based on the coverage points. The coverage testbench 202 may access the coverage model 108 using the coverage model interface 404. As an example, the coverage data 206 can be generated based on the coverage points defined in the coverage model 108.

At step 512, the method may include aggregating, by the coverage testbench, the coverage data based on the coverage points to provide the functional coverage. The coverage testbench 202 can use the coverage aggregation module 406 to aggregate the coverage data 206. The aggregation can be performed separately from the functional simulations. The coverage testbench 202 can use the output module 408 to provide the overall functional coverage of the DUT 102 based on the aggregated coverage data. The overall functional coverage can provide the coverage data 206 from the saved stimulus data for the all the simulations that correctly verified the DUT 102 over a period of time, which can allow performing deeper analysis on the robustness of the stimulus.

At step 514, the method may include determining that the functional coverage contains a gap. For example, analysis 208 can be performed on the functional coverage provided by the coverage testbench 202 to identify any coverage gaps from the simulations. The coverage gaps may indicate that certain input values or combinations of inputs were missing in the stimulus data and therefore not exercised in the simulations. For example, referring back to FIG. 3, if the coverage model 108 was expecting ten different values for combinations of A and B inputs in the stimulus data 302, but the stimulus data 302 only had four values, the coverage points may indicate a coverage gap or low coverage for the valid combination of the inputs A and B.

At step 516, the method may include generating new stimulus data that causes the integrated circuit design to perform a function that covers the gap. The new stimulus data can be generated to cause the DUT 102 to perform the function that covered the gap. For example, some of the constraints applied to the stimulus generator 106 can be tuned or altered to generate the new stimulus data to cover the gaps, or one or more targeted test cases can be developed that can cover the missing valid combinations of the inputs A and B to cause the DUT 102 to perform the function related to the coverage gap.

At step 518, the method may include running another functional simulation by inputting the new stimulus data into the integrated circuit design. The new stimulus data can be inputted to the DUT 102 to perform another functional simulation using the simulation testbench 104. The simulation results 210 can be used to determine whether the new stimulus data performed the function related to the coverage gap correctly. In certain examples, multiple test cases can be generated to ensure that all the missing values of the stimulus data are covered.

At step 520, the method may include saving the new stimulus data in the stimulus database. The new stimulus data can be stored in the stimulus database 204 as it is being generated in step 516, or while running the functional simulation in step 518. For example, the step 520 can be part of the step 516 or the step 518.

At step 522, the method may include reading, by the coverage testbench, the new stimulus data from the stimulus database. The new stimulus data can be read by the coverage testbench 202 from the stimulus database 204 using the reading module 402.

At step 524, the method may include re-aggregating the coverage data to include coverage of the new stimulus data. The coverage testbench 202 can re-aggregate the coverage data 206 using the coverage model 108 to include coverage of the new stimulus data. The coverage of the new stimulus data may be improved as indicated by the coverage points in the coverage data 206 since the new stimulus data may include the additional values of the combination of A and B inputs, which were missing in the saved stimulus data in the step 508.

Generally, the steps 502-506 are performed over a long period of time (e.g., weeks or months) as the DUT 102 is tested for different functionalities based on the specification by running different simulations on the DUT 102. As discussed with reference to FIG. 1, the coverage data is collected during the simulation runs using the process flow 100. Thus, collecting the coverage data during the steps 502-506, identifying the coverage gaps in the step 514, and creating and running the new stimulus in the steps 516-520 to fill the coverage gaps can take a very long time according to the process flow 100.

In certain embodiments, as discussed with reference to the process flow 200, the coverage data is not collected in the steps 502-506, which can make the simulation runs in the steps 502-506 much faster than running with the coverage collection simultaneously. Certain embodiments can use the saved stimulus in the step 506 to collect the coverage data in the steps 508-510 in a very short time, which can be 100× faster than collecting the coverage data in the steps 502-506 using the process flow 100. This can allow refining the coverage model 108 and re-aggregating the coverage data significantly faster as the new stimulus is added to test new features, fix bugs, or fill the coverage gaps. In certain embodiments, the steps 508, 510, 512, 514, 522, or 524 can be performed using the coverage script as discussed with reference to FIG. 2.

Figure 6:
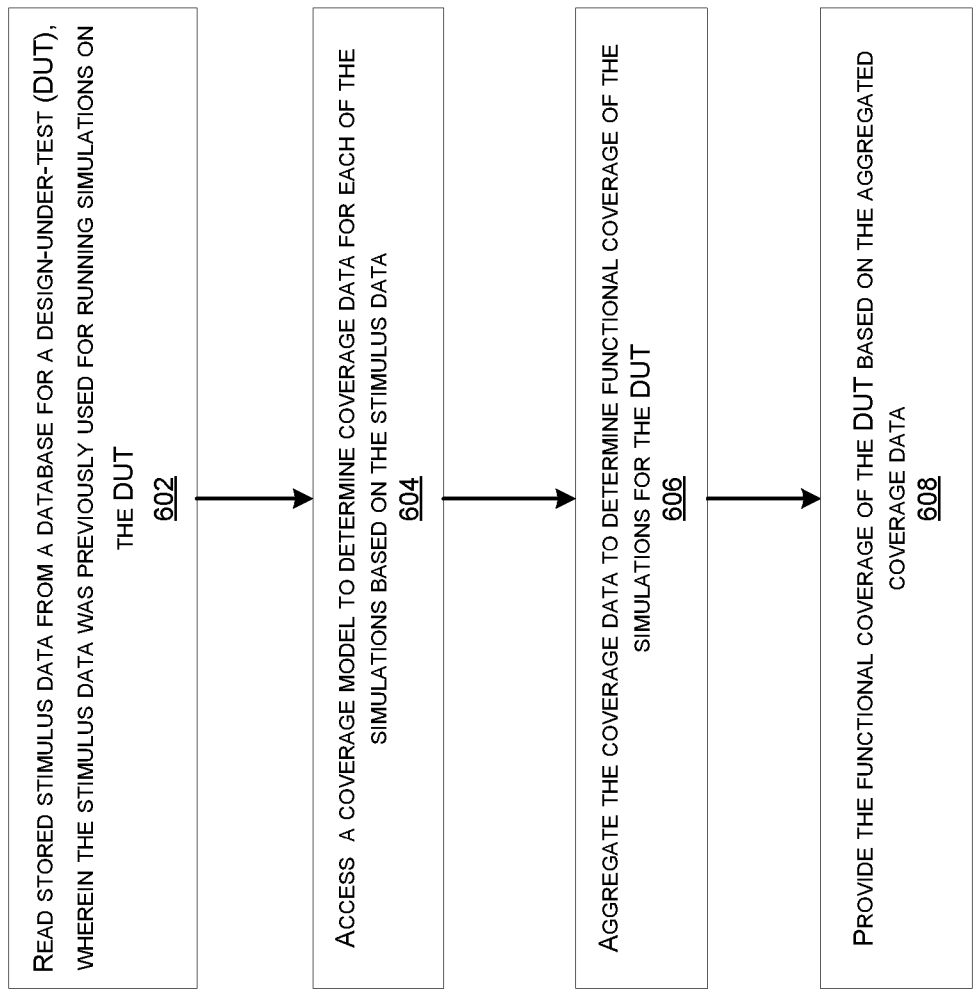
FIG. 6 illustrates a flowchart for a computer-implemented method to provide functional coverage of the DUT from saved stimulus data using the coverage testbench, in certain embodiments.

FIG. 6 illustrates a flowchart 600 for a computer-implemented method to provide functional coverage of the DUT from saved stimulus data using a coverage testbench, in certain embodiments. The method can be performed by the coverage testbench 202 using the process flow 200. The computer-implemented method can be executed when certain instructions, which are stored in a non-transitory computer readable medium, are executed by one or more processors of a computing device. For example, the computing device can be part of a server which can also support running the simulations, or aggregating the coverage data using the EDA tools or the coverage script.

At step 602, the method may include reading stored stimulus data from a database for a DUT. The stimulus data was previously used for running simulations on the DUT. The coverage testbench 202 can read the stored stimulus data from the stimulus database 204 using the reading module 402. As discussed with reference to FIGS. 2-5, the stimulus data was generated and used previously for running simulations on the DUT 102. For example, the stimulus data was generated and used to perform simulations as discussed with reference to the steps 502-506 in FIG. 5.

At step 604, the method may include accessing a coverage model to determine coverage data for each of the simulations based on the stimulus data. For example, the coverage testbench 202 can be used to load the coverage model 108 using the coverage model interface 404. The coverage model 108 may include the coverage points for collecting the coverage data from the saved stimulus data based on the specification of the DUT 102.

At step 606, the method may include aggregating the coverage data to determine functional coverage of the simulations for the DUT. The coverage testbench 202 can use the coverage aggregation module 406 to aggregate the coverage data 206 based on the coverage points defined in the coverage model 108, without running any simulations on the DUT 102.

At step 608, the method may include providing the functional coverage of the DUT based on the aggregated coverage data. The coverage testbench 202 can use the output module 408 to provide the functional coverage of the DUT 102. The functional coverage of the DUT 102 can provide an overall coverage of the DUT 102 from all the simulations that were performed for functional verification of the DUT 102 over a period of time. The functional coverage can be used to determine quality of the stimulus data and identify gaps in the stimulus data. In certain examples, when the coverage model 108 is updated to fix errors, or when the DUT 102 is updated to fix bugs or add new features, the coverage testbench 202 can be used to aggregate the updated coverage data and provide the updated functional coverage without re-running the simulations.

The steps 602-608 can be performed using the coverage script or the EDA tool as discussed with reference to FIG. 2. The steps 602-608 can be performed to aggregate the coverage data offline in a significantly shorter time duration as compared to aggregating the coverage data during the simulation runs. Since the steps 602-608 are performed without running any simulations on the DUT 102, a runtime for aggregating the coverage data from the stimulus data using the coverage testbench 202 can be about one percent of a runtime for running the simulations on the DUT 102. Additionally, performing the simulations on the DUT 102 without collecting the coverage data can speed up the simulation process, thus reducing the verification cycle and the product development cycle.

Figure 7:
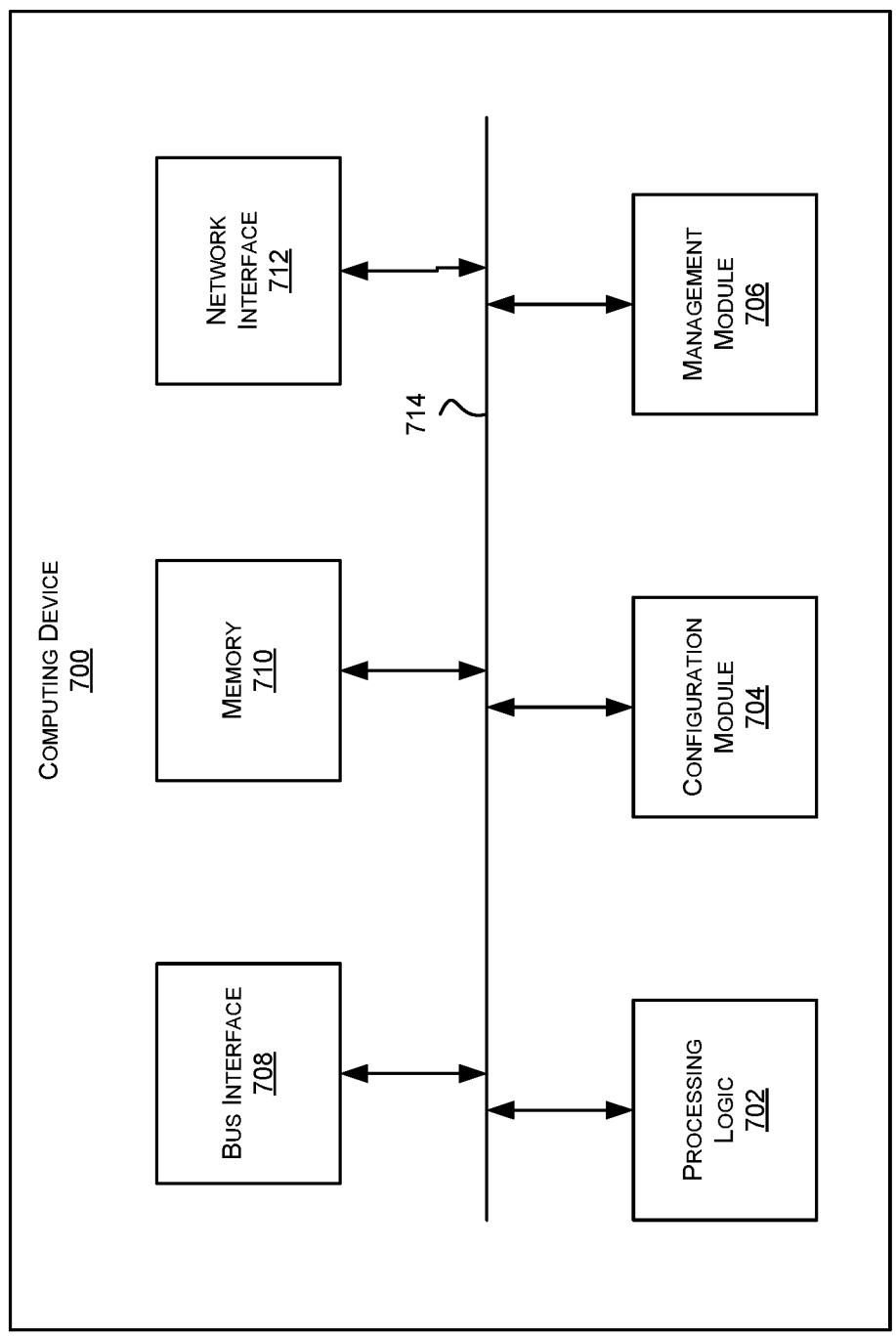
FIG. 7 illustrates an example of a computing device, according to certain aspects of the disclosure.

FIG. 7 illustrates an example of a computing device 700. Functionality and/or several components of the computing device 700 may be used without limitation with other embodiments disclosed elsewhere in this disclosure, without limitations. In some implementations, computing device 700 may act as a network device. The computing device 700 may facilitate processing of packets and/or forwarding of packets from the computing device 700 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 700 may be the recipient and/or generator of packets. In some implementations, the computing device 700 may modify the contents of the packet before forwarding the packet to another device. The computing device 700 may be a peripheral device coupled to another computer device, a switch, a router or any other suitable device enabled for receiving and forwarding packets.

In one example, the computing device 700 may include processing logic 702, a configuration module 704, a management module 706, a bus interface module 708, memory 710, and a network interface module 712. These modules may be hardware modules, software modules, or a combination of hardware and software. In certain instances, modules may be interchangeably used with components or engines, without deviating from the scope of the disclosure. The computing device 700 may include additional modules, which are not illustrated here. In some implementations, the computing device 700 may include fewer modules. In some implementations, one or more of the modules may be combined into one module. One or more of the modules may be in communication with each other over a communication channel 714. The communication channel 714 may include one or more busses, meshes, matrices, fabrics, a combination of these communication channels, or some other suitable communication channel.

The processing logic 702 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 702 may include processors developed by ARM®, MIPS®, AMID®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 702 may be stored on a computer-readable storage medium, for example, in the form of a computer program. The computer-readable storage medium may be non-transitory. In some cases, the computer-readable medium may be part of the memory 710.

The memory 710 may include either volatile or non-volatile, or both volatile and non-volatile types of memory. The memory 710 may, for example, include random access memory (RAM), read only memory (ROM), Electrically Erasable Programmable Read-Only Memory (EEPROM), flash memory, and/or some other suitable storage media. In some cases, some or all of the memory 710 may be internal to the computing device 700, while in other cases some or all of the memory may be external to the computing device 700. The memory 710 may store an operating system comprising executable instructions that, when executed by the processing logic 702, provides the execution environment for executing instructions providing networking functionality for the computing device 700. The memory may also store and maintain several data structures and routing tables for facilitating the functionality of the computing device 700.

In some implementations, the configuration module 704 may include one or more configuration registers. Configuration registers may control the operations of the computing device 700. In some implementations, one or more bits in the configuration register can represent certain capabilities of the computing device 700. Configuration registers may be programmed by instructions executing in the processing logic 702, and/or by an external entity, such as a host device, an operating system executing on a host device, and/or a remote device. The configuration module 704 may further include hardware and/or software that control the operations of the computing device 700.

In some implementations, the management module 706 may be configured to manage different components of the computing device 700. In some cases, the management module 706 may configure one or more bits in one or more configuration registers at power up, to enable or disable certain capabilities of the computing device 700. In certain implementations, the management module 706 may use processing resources from the processing logic 702. In other implementations, the management module 706 may have processing logic similar to the processing logic 702, but segmented away or implemented on a different power plane than the processing logic 702.

The bus interface module 708 may enable communication with external entities, such as a host device and/or other components in a computing system, over an external communication medium. The bus interface module 708 may include a physical interface for connecting to a cable, socket, port, or other connection to the external communication medium. The bus interface module 708 may further include hardware and/or software to manage incoming and outgoing transactions. The bus interface module 708 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 708 may include the physical layer for any of these bus protocols, including a connector, power management, and error handling, among other things. In some implementations, the computing device 700 may include multiple bus interface modules for communicating with multiple external entities. These multiple bus interface modules may implement the same local bus protocol, different local bus protocols, or a combination of the same and different bus protocols.

The network interface module 712 may include hardware and/or software for communicating with a network. This network interface module 712 may, for example, include physical connectors or physical ports for wired connection to a network, and/or antennas for wireless communication to a network. The network interface module 712 may further include hardware and/or software configured to implement a network protocol stack. The network interface module 712 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 700 may include multiple network interface modules, each configured to communicate with a different network. For example, in these implementations, the computing device 700 may include a network interface module for communicating with a wired Ethernet network, a wireless 802.11 network, a cellular network, an Infiniband network, etc.

The various components and modules of the computing device 700, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 7, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer-implemented method for determining functional coverage of stimulus data used for simulating an integrated circuit design, the method comprising:
   for each of a plurality of functional simulations used to verify the integrated circuit design:
      generating the stimulus data that causes the integrated circuit design to perform a function;
      running a functional simulation by inputting the stimulus data into the integrated circuit design, and verifying that the integrated circuit design performed the function correctly; and
      saving the stimulus data in a stimulus database;
   subsequent to running the plurality of functional simulations, reading, by a coverage testbench, the stimulus data stored in the stimulus database;
   determining, by the coverage testbench, coverage data from the stimulus data for each of the functional simulations using a coverage model, the coverage model comprising coverage points based on a specification of the integrated circuit design; and
   aggregating, by the coverage testbench, the coverage data based on the coverage points to determine the functional coverage.

2. The computer-implemented method of claim 1, further comprising:
   determining that the functional coverage contains a gap;
   generating new stimulus data that causes the integrated circuit design to perform a function that covers the gap;
   running a new functional simulation by inputting the new stimulus data into the integrated circuit design; and
   storing the new stimulus data to the stimulus database.

3. The computer-implemented method of claim 2, further comprising:
   reading, by the coverage testbench, the new stimulus data from the stimulus database; and
   re-aggregating, by the coverage testbench, the coverage data to include coverage of the new stimulus data.

4. The computer-implemented method of claim 1, wherein the stimulus data is generated randomly.

5. A computer-implemented method, comprising:
   reading, by a coverage testbench, stored stimulus data from a database for a design-under-test (DUT), wherein the stimulus data was previously used for running simulations on the DUT;
   accessing, by the coverage testbench, a coverage model to determine coverage data for each of the simulations based on the stimulus data;
   aggregating, by the coverage testbench, the coverage data to determine functional coverage of the simulations for the DUT; and
   providing, by the coverage testbench, the functional coverage of the DUT based on the aggregated coverage data.

6. The computer-implemented method of claim 5, further comprising:
   accessing, by the coverage testbench, an updated coverage model based on changes made to the DUT or to the coverage model to determine updated coverage data;
   aggregating, by the coverage testbench, the updated coverage data; and
   providing, by the coverage testbench, updated functional coverage of the DUT without re-running the simulations.

7. The computer-implemented method of claim 5, wherein aggregating the coverage data from the stimulus data using the coverage model is performed separately from running the simulations on the DUT.

8. The computer-implemented method of claim 5, wherein the coverage model is generated based on a specification of the DUT.

9. The computer-implemented method of claim 5, wherein at least a portion of the stimulus data is generated randomly using constraints.

10. The computer-implemented method of claim 5, wherein a portion of the stimulus data was generated prior to running the simulations.

11. The computer-implemented method of claim 5, wherein a runtime for aggregating the coverage data from the stimulus data is about one percent of a runtime for running the simulations on the DUT.

12. The computer-implemented method of claim 5, wherein the coverage testbench or the coverage model is implemented using a scripting language.

13. The computer-implemented method of claim 5, wherein the coverage testbench is part of an electronic design automation (EDA) tool, and the coverage model includes hardware verification language (HVL) constructs supported by the EDA tool for aggregating the coverage data.

14. The computer-implemented method of claim 5, wherein the coverage data includes coverage points based on an implementation of the DUT.

15. The computer-implemented method of claim 5, wherein the aggregated coverage data indicates which valid combinations of inputs to the DUT were used in the simulations.

16. A non-transitory computer readable medium having stored therein instructions that, when executed by one or more processors, cause the one or more processors to execute a method comprising:
   reading stored stimulus data from a database for a design-under-test (DUT), wherein the stimulus data was previously used for running simulations on the DUT;
   accessing a coverage model to determine coverage data for each of the simulations based on the stimulus data;
   aggregating the coverage data to determine functional coverage of the simulations for the DUT; and
   providing the functional coverage of the DUT based on the aggregated coverage data.

17. The non-transitory computer readable medium of claim 16, further comprising:
   accessing an updated coverage model based on changes made to the DUT or to the coverage model to determine updated coverage data;
   aggregating the updated coverage data; and
   providing updated functional coverage of the DUT without re-running the simulations.

18. The non-transitory computer readable medium of claim 16, wherein aggregating the coverage data from the stimulus data using the coverage model is performed separately from running the simulations on the DUT.

19. The non-transitory computer readable medium of claim 16, wherein the aggregated coverage data indicates which valid combinations of inputs to the DUT were used in the simulations.

20. The non-transitory computer readable medium of claim 16, wherein the DUT is a register transfer language (RTL) model of an integrated circuit device.

* * * * *